(12) United States Patent
Lai

(10) Patent No.: US 8,898,897 B2
(45) Date of Patent: Dec. 2, 2014

(54) METHOD OF MAKING USER-FRIENDLY USB MALE CONNECTOR

(71) Applicant: Joseph Lai, San Pedro, CA (US)

(72) Inventor: Joseph Lai, San Pedro, CA (US)

( * ) Notice: Subject to any disclaimer, the term of this patent is extended or adjusted under 35 U.S.C. 154(b) by 17 days.

(21) Appl. No.: 13/764,794

(22) Filed: Feb. 12, 2013

(65) Prior Publication Data

US 2014/0223733 A1    Aug. 14, 2014

(51) Int. Cl.
*H01R 43/20* (2006.01)
*H01R 43/24* (2006.01)
*H05K 1/00* (2006.01)
*H01R 24/62* (2011.01)
*H01R 107/00* (2006.01)

(52) U.S. Cl.
CPC ............... *H01R 43/24* (2013.01); *H05K 1/00* (2013.01); *H01R 24/62* (2013.01); *H01R 2107/00* (2013.01)
USPC .................. 29/876; 29/874; 29/877; 29/878

(58) Field of Classification Search
USPC ............... 29/876, 843, 874, 877, 878, 884; 439/79, 607.01, 607.31, 660, 906
See application file for complete search history.

(56) References Cited

U.S. PATENT DOCUMENTS

| | | | |
|---|---|---|---|
| 4,865,562 A | 9/1989 | Berg | |
| 6,152,761 A | 11/2000 | Wellinsky | |
| 6,200,171 B1 | 3/2001 | Fusselman | |
| 6,285,551 B1 | 9/2001 | Brandenburg | |
| 7,004,794 B2 * | 2/2006 | Wang et al. | 439/660 |
| 7,025,638 B2 | 4/2006 | Mott | |
| 7,069,370 B2 | 6/2006 | Sukegawa | |
| 7,507,119 B2 * | 3/2009 | Ni et al. | 439/607.31 |
| 7,878,865 B2 | 2/2011 | Desrosiers | |
| 8,535,034 B2 | 9/2013 | Hellberg | |
| 8,696,967 B2 | 4/2014 | Haimoff | |
| 2014/0017913 A1 | 1/2014 | Colwell | |

* cited by examiner

*Primary Examiner* — Thiem Phan

(57) ABSTRACT

A new method for making and manufacturing the User-Friendly USB Male connectors which is faster, lower cost, more energy efficient, waterproof and reliable, with no expensive tooling and molding required, having better quality and being easily adaptable for automated assembly.

20 Claims, 7 Drawing Sheets

101

102

103

104

105

201

202

203

104

204

201

301

302

304

303

104

METHOD OF MAKING USER-FRIENDLY USB MALE CONNECTOR

CROSS-REFERENCES

This application incorporates by reference the U.S. Pat. No. 7,717,717 in its entirety. Joseph Lai is the sole inventor of the U.S. Pat. No. 7,717,717 and the invention is disclosed in this application.

FIELD OF THE INVENTION

This present invention is specifically to provide an optimized solution for making the new User-Friendly USB Male connector which is reversible and can fit and work in the female USB Male connectors in either orientation.

BACKGROUND OF THE INVENTION

Conventional, non User-Friendly USB Male connectors have been in the market for over 16 years (since 1996.) The old-fashioned methods of making the conventional, non User-Friendly USB Male connectors have become obsolete now. Using old fashioned methods to make the User-Friendly USB Male connectors are too slow and expensive, very difficult to control the quality, and not operator/automation friendly.

Conventional non User-Friendly USB Male connectors are very complicated to make. It uses a precision injection-molded holder to hold the precision stamped metal pins. Conventional methods of making old-fashioned USB Male connectors require many steps of pre-assembly of the components because of its complexity. The final assembly put everything together by shoving the pre-assembled holder with metal pins into the metal housing.

On the other hand, the new User-Friendly USB is much simpler to make, Precision stamped pins are replaced by a thin, flat, rigid printed circuit board (PCB). There is no need for a precision injection-molded holder or the pre-assembly of the metal pins. The PCB is simply held afloat in the middle of the metal housing by a pair of spacers, one on the top and the other under the PCB. Therefore, the old prior art method of making conventional non User-Friendly USB Male connectors should not apply to the new User-Friendly USB Male connectors.

As far as quality control is concerned, the new User-Friendly USB Male connectors require tighter, more rigid strength to hold the PCB without slack compares to regular male USB connector. It would be extremely difficult to achieve this method of manufacture with conventional methods.

SUMMARY OF THE INVENTION

This present invention specifically addresses the issues of the drawbacks and difficulties of conventional methods to explain a new method of making the User-Friendly USB Male connectors. Not only does the new method provide a fast, low-cost solution to the manufacturing problem, but it also maintains the highest quality for making the User-Friendly USB Male connectors.

The present invention takes advantage of the metal housing of the User-Friendly USB as the "mold base" to hold the PCB by either injecting hot melt or cold cure epoxy or adhesive materials into the metal housing. Here are the steps:

The PCB is pre pick-and-placed onto a Teflon or similar heat-resistant and non-stick holding fixture. Then, the metal housing is inserted into the same heat resistance holding fixture with the PCB already in the fixture.

The spacers of the User-Friendly USB Male connector now can be placed by pouring either a liquid form of heat or non-heat curable epoxy, UV curable adhesive or heat-up solid melt-able thermal plastic resin. A cool down period cures the sealant to finish the assembly of the User-Friendly USB Male connector.

There are many advantages of the new method, such as:
1. No mold is required to make the spacer, which saves tremendous time and money
2. No pre-process of putting the PCB together with the spacers
   a. No over-mold of the spacer onto the PCB
   b. No assembly of attaching spacers onto the PCB
3. PCB is less expensive to fabricate since we can use low temperature (Tg as glass transition temperature) PCB material
4. There is no waste of space since the PCBs can be placed closely together on an array
5. There is no slack for the spacer holding the PCB as the resin is tightly cured inside the metal housing
6. There is no final assembly of shoving the pre-assembled piece into the metal housing
7. The New User-Friendly USB Male connector is air-tight and water-proof, which the old style was not
8. Assembly time is reduced from 32 seconds to 8 seconds when using hand assembly
9. The metal housing will not be distorted or expanded because of brute force of shoving the pre-assembled piece
10. Temperature stable, unlike pre-attached then shoving method, the PCB is now mold over by the melted spacers, so it is very stable in a much wider temperature range
11. Transition from manual labor assembly to automation can be easily realized

DETAILED DESCRIPTION

Figure 1:
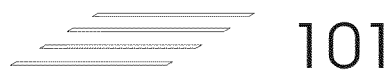
FIG. 1 shows prior art of conventional USB Male connector using conventional method
Figure 1:
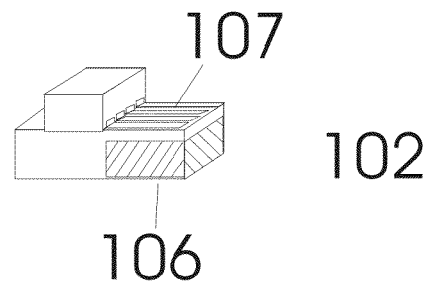
Figure 1:
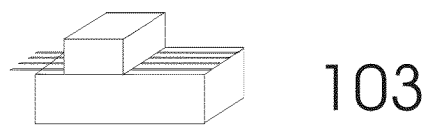
Figure 1:
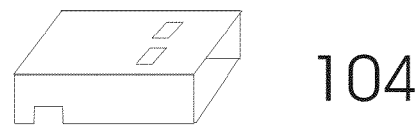
Figure 1:
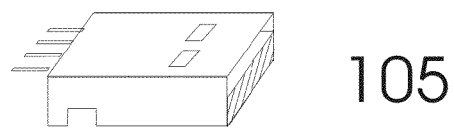

FIG. 1 shows the prior art of conventional parts for making conventional USB male connector. This method of making conventional USB Male connector is complicated, cumbersome, time consuming and expensive. It requires precision stamping to fabricate the four contacting pins 101. With the four contacting pins, a precision plastic molded contacting pin holder 102 has to be made to hold these previously mentioned contacting pins. Notice the excessive plastic 106 which is used in the bottom of the plastic pin holder, making the conventional USB Male connector not User-Friendly (can not go either way). Once the four contacting pins 101 are inserted into the groves 107 of the plastic pin holder as 103, final assembly is required to push the pin holder with the four contacting pins into the metal housing 104 to finish assemble conventional USB male connector 105.

Figure 2:
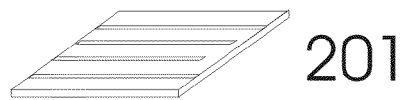
FIG. 2 shows prior art of User-Friendly USB Male connector using conventional method
Figure 2:
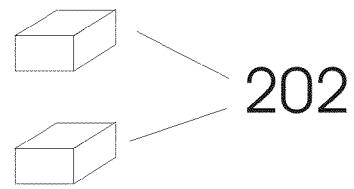
Figure 2:
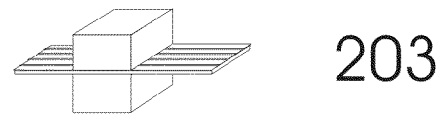
Figure 2:
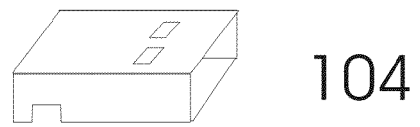
Figure 2:
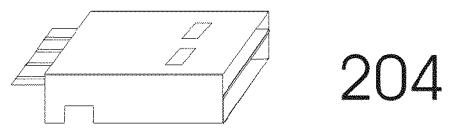

FIG. 2 also shows prior art of parts and making User-Friendly USB male connector using conventional method. Metal housing 104 of User-Friendly USB and regular USB is the same. Using conventional method to make User-Friendly USB Male connector could be a painful, poor quality, slow and expensive process. Printed circuit board, or PCB 201 is pre-fabricated by a PCB house. Imitating the old conventional method, the two holding spacers 202 somehow must be attached to the PCB 201 tightly, so the pre-assembly 203 is realized.

There are many other ways that the spacers can be attached to the PCB 201. Precision molded plastic parts can be made or simply cut from a sheet of plastic (with the right thickness) individually for the operators by hand to attach to the PCB, or there could be more advanced over-molding for directly injecting, silk-screening or stencil printing the thermal plastic resin as spacers onto the PCB 201.

There are many issues of using the PCB 201 as part of the User-Friendly USB Male connectors. PCB by its nature has been fabricated by laminating layers of Fire Retardant (FR4) or fiber glass materials with pre-impregnated layers of epoxy sheets. It is very difficult to maintain the overall PCB thickness. Typical tolerance of a PCB has ±10% tolerance which would make it extremely difficult to maintain the overall thickness with the spacers for the pre-assembled piece 203 when the old method of assembly was used.

If the PCB is too thick, the pre-assembled piece 203 would be very difficult to insert into the metal housing. If insertion is done by brute force, the metal housing 104 will be distorted, deformed, expanded or destroyed. On the other hand if the over-all thickness of the pre-assembled piece 203 is too thin, the whole pre-assembled piece will be too loose to hold inside by the metal housing, has no strength to hold the PCB and PCB will simply fall off. The PCB 201 may tilt, not straight, un-even space, weak, deflect and when user inserting the User-Friendly USB into the female USB socket. Damage of both the User-Friendly male USB and the mating female USB connectors will happen.

It is experimented that the tolerance would have to be less than ±0.002 inch by using this old method. Overall error accumulates as the spacers 202, metal housing 104 and PCB 201 all have their +/− tolerances in thickness. Temperature coefficient is another factor as all materials have their own expanding or shrinkage ranges.

To maintain the overall thickness, the over-molding method seems to be the answer to solve the precision tolerance problem as mentioned, assuming metal housing is in tight tolerances, but has its own price to pay. To be able to do the over-molding, PCB material 201 has to withstand very high temperatures, wasting PCB space as the PCBs can not be densely populated. An extremely expensive plastic injection mold would be required. Time would be wasted for injecting the molten resin with dedicated operators or automated machines to feed the PCB inside the mold.

After the pre-assembled piece 203 is completed, final assembly would also be required to shove it 203 inside the metal housing 104 so the User-Friendly USB male connector product 204 is ready.

Figure 3:
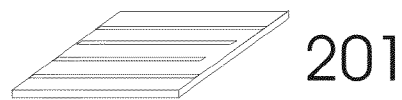
FIG. 3 shows presented new method of making User-Friendly USB connectors with all required components or raw-materials
Figure 3:
Figure 3:
Figure 3:
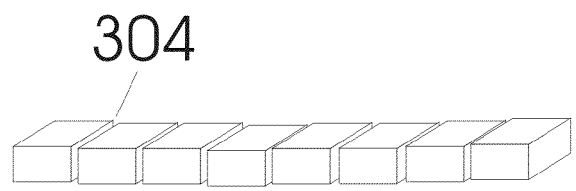
Figure 3:
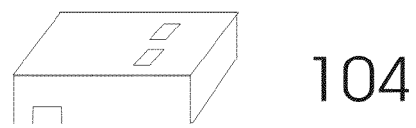

The new method disclosed is a much easier way of making the User-Friendly USB Male connector. FIG. 3 shows all the un-assembled parts/pieces, the same PCB 201, with the same metal housing 104 the conventional USB would use. New spacer materials 301, 302 are made of thermal melt-able plastic, such as ABS, acrylic, Hi-impact styrene, glass filled Nylon or many other materials. The spacers are suggested to be scored/v-cut or molded a grove 304 on a thermal plastic strip 303 so the handling is much easier for operators or an automated machine to pick and place handling.

Figure 4:
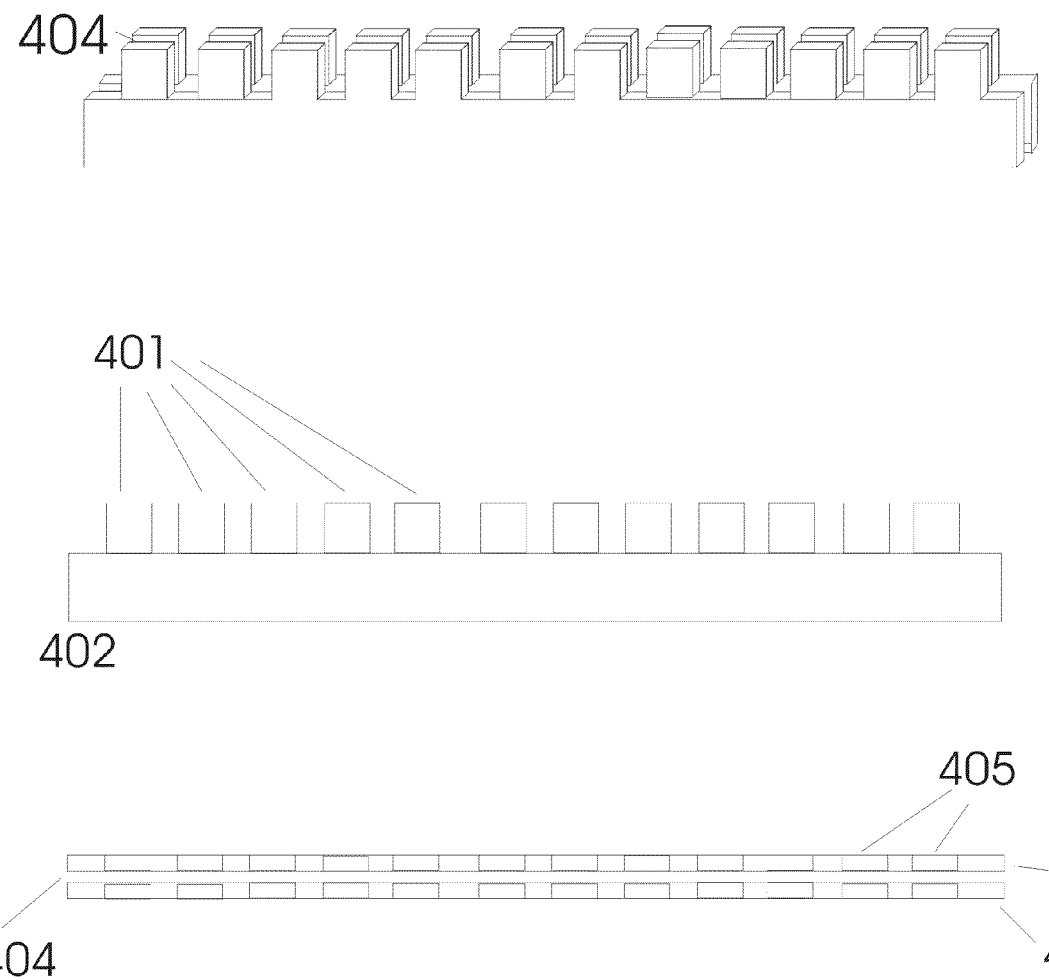
FIG. 4 shows the fixture for new method of making User-Friendly USB connector

FIG. 4 shows the required fixture for the new method of making User-Friendly USB Male connectors. Viewing from the front of the fixture strip 402 and showing the teeth/stick-up holders 401 for holding the PCB 201, metal housing 104 and a pair of spacers 301, 302.

The two fixture strips 402, 403 are made of heat-resistance, chemical-resistance, anti-scratch, non-stick material such as Polytetrafluoroethylene (PTFE) or also known as Teflon™ or similar materials. With the thin gap (0.025 inch) between the two Teflon strips, the PCB 201 now can fit inside the gap 404 and be held onto the fixture.

Figure 5:
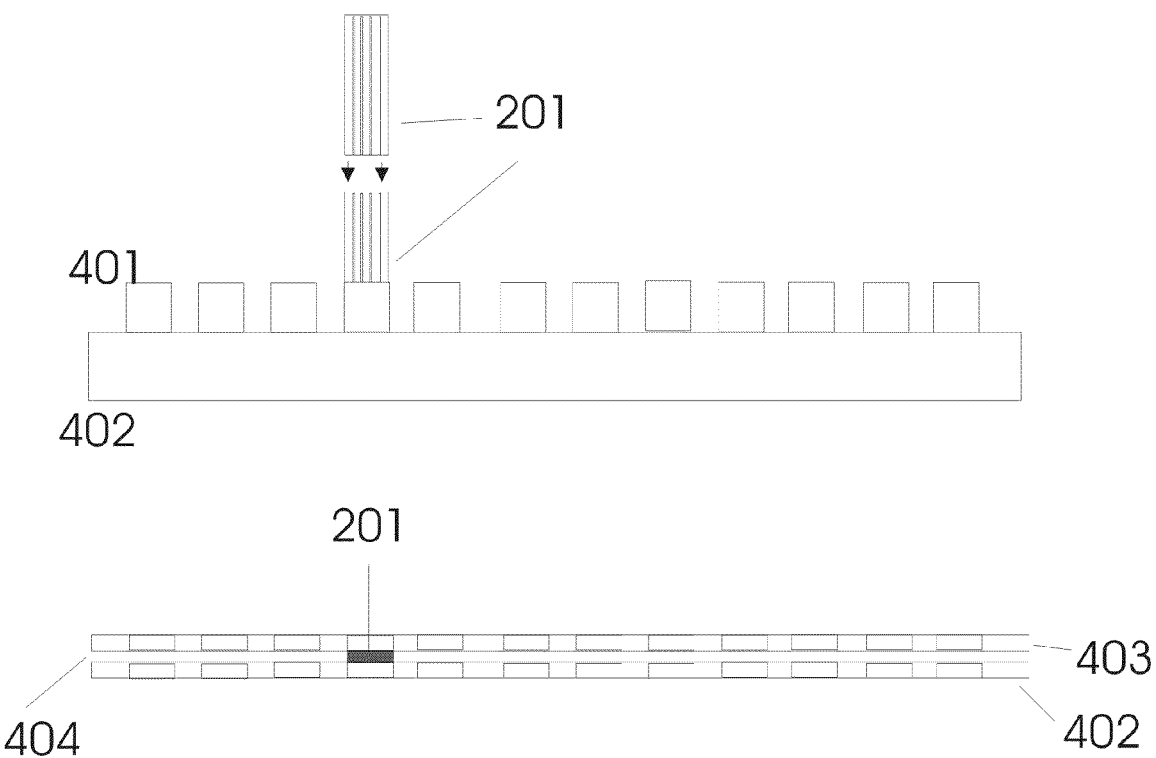
FIG. 5 shows step 1 of new method of making User-Friendly USB Male connector

FIG. 5 shows the first step of new method of assembling the User-Friendly USB Male connector. The PCB 201 is inserted vertically from top into the gap 404 of the Teflon™ holder. Teflon™ is not only heat resistance, chemical resistance and non-stick but also great for friction resistance too. Therefore this Teflon™-made fixture is built to last.

Figure 6:
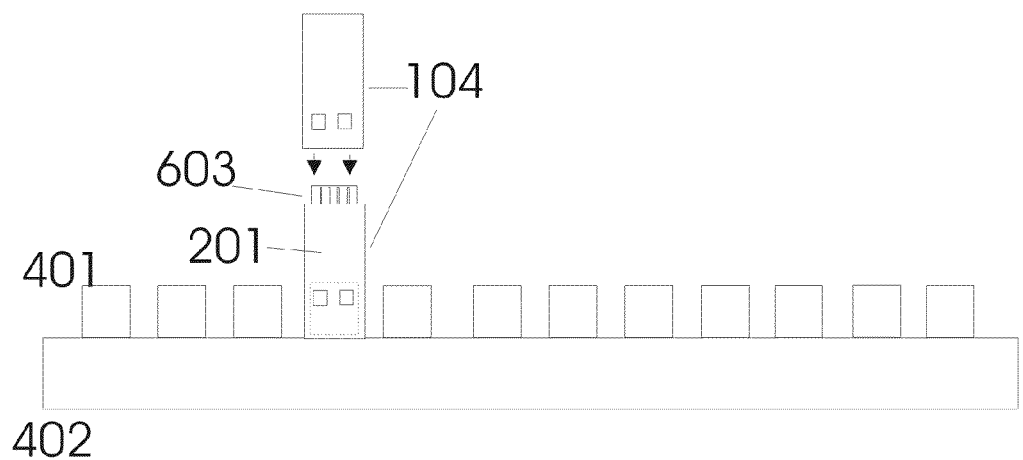
FIG. 6 shows step 2 of new method of making User-Friendly USB Male connector
Figure 6:
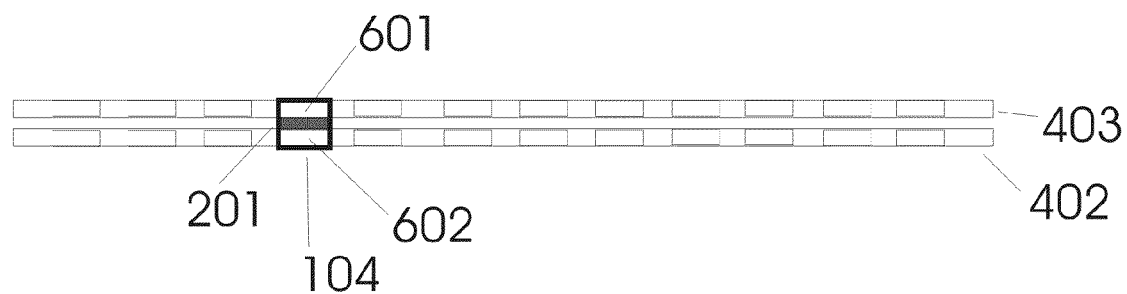

FIG. 6 shows the second step of the new method of assembling the User-Friendly USB Male connector. The metal housing 104 is also inserted vertically into the Teflon™ teeth holder as we can see.

After the metal housing 104 was completely inserted into the Teflon™ fixture, the tail section 603 of the PCB 201 is shown.

FIG. 6 also shows two cavities have now been created after we have successfully insert the metal housing 104 into the fixture as we can see 601, 602, viewing from the top of the fixture.

Figure 7:
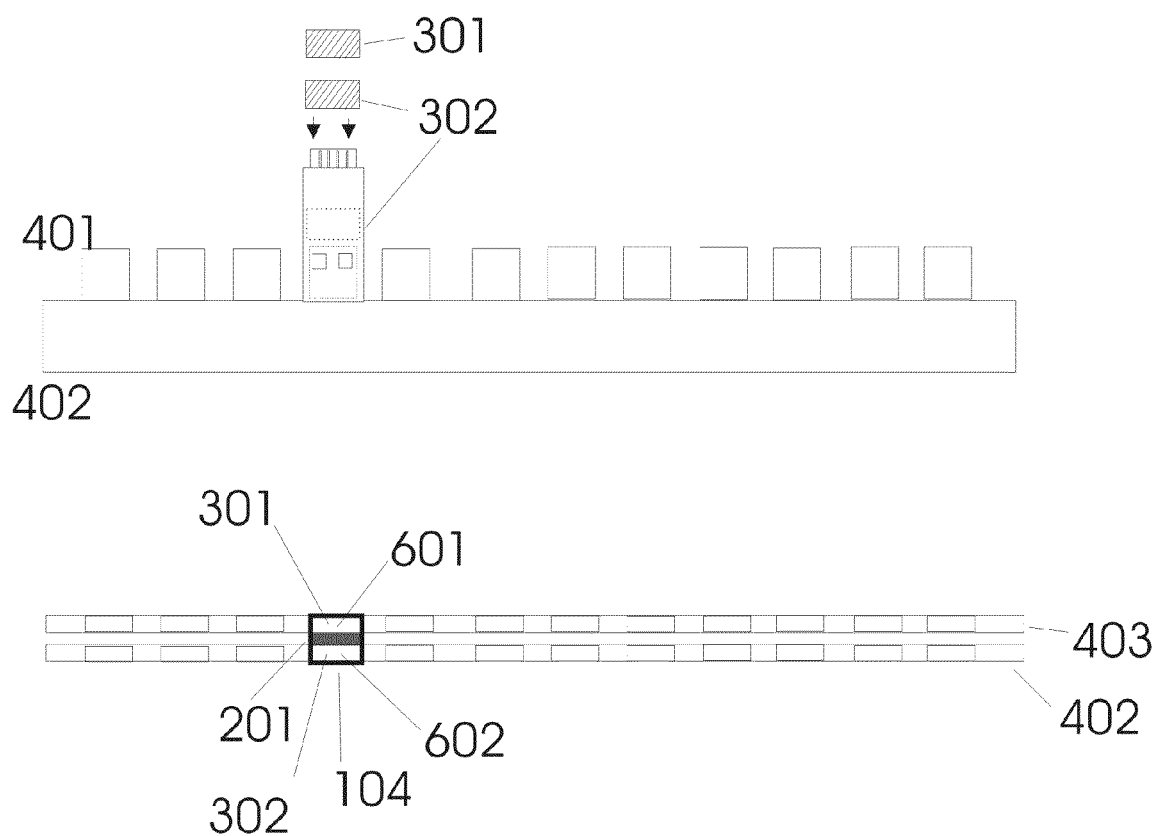
FIG. 7 shows step 3 of new method of making User-Friendly USB Male connector

FIG. 7 shows how we finish the assembly by filling up the cavities 601, 602 with thermal melt-able plastic material 301, 302. The thermal melt-able plastic material will melt when we apply heat to it. When the thermal melt-able plastic material melts, the gravitational force will help leveling the melted plastic material and fill-up inside of the cavities. After it cooling down, cured plastic material will become the spacers to hold the PCB securely, seamlessly and tightly inside the metal housing. Thus we have finished the assembly of the User-Friendly USB Male connectors.

Other means of meting the thermal melt-ableplastic spacers are also possible, chemical solvent, ultrasonic, supersonic and magnetic radio frequency field of induction for heat.

Other spacer materials are also being considered for making high-temp User-Friendly USB Male connectors. For RoHS (non-toxic, no lead) or regular lead-soldered Surface Mount Technology (SMT) reflow oven, glass-filled Nylon™, ceramic, cement or fiber glass (FR4) materials are considered. It is not suggested to heat up and melt these type of material as the required melting temperature is very high (over 500 degree F.), therefore, slightly thinner solid material can be easily pre-inserted into the metal housing cavities 601, 602 first, followed by applying high-temp grade of epoxy or adhesive materials to cure to secure the PCB as spacers. No heat on the spacers is required in this situation.

Of course, directly dropping, dispensing or injecting the liquid-form or pre-heated and melted plastic, adhesive, UV glue, epoxy, hot-melt glue as spacers also should be considered. It is more difficult and slow to fill the cavities with a liquid form of adhesives without leaking Another major problem is when these materials cure; a mold release agent might be required for the finished User-Friendly USB Male connectors to separate from the Teflon fixtures.

These methods are good for both making User-Friendly 2.0 male USB and 3.0 male USB connectors. The User-Friendly 3.0 male USB is backward compatible to User-Friendly 2.0 USB with 5 additional contacting pins on the PCB. The spacer materials are also melted and cured to secure the PCB inside the metal housing to make the User-Friendly 3.0 male USB connectors.

I claim:

1. A method of making User-Friendly USB Male connectors, comprising steps of:
    (a) providing a fixture with a gap to hold a Printed Circuit Board (PCB), a holder to hold a metal housing with said gap inside;
    (b) inserting said PCB into said gap;
    (c) inserting said metal housing into said holder;
    (d) inserting solid melt-able material inside said metal housing;
    (e) melting said solid melt-able material until it is melted; and,
    (f) curing said melted material,
    whereby spacers are formed by cured said melted material that secure the said PCB within said metal housing.

2. The method of making User-Friendly USB Male connector in claim 1, wherein said fixture is made of heat-resistance, chemical-resistance, non-stick, anti-scratch and dimensional-stable materials.

3. The method of making User-Friendly USB Male connector in claim 2, wherein said heat-resistance, chemical-resistance, non-stick, anti-scratch, dimensional-stable material is Polytetrafluoroethylene (PTFE), also known as Teflon™ or equivalent.

4. The method of making User-Friendly USB Male connector in claim 1, wherein said solid melt-able material comprises of a plurality of different materials, ABS, acrylic, Hi-Impact Styrene, hot-melt glue, Nylon thermal plastic materials or equivalent.

5. The method of making User-Friendly USB Male connector in claim 1, wherein said User-Friendly USB Male connector is for low-temperature assembly purpose.

6. The method of making User-Friendly USB Male connector in claim 1, wherein said method of making User-Friendly USB Male connector is for both manual labor and automated assembly.

7. The method of making User-Friendly USB male connector in claim 1, wherein said melting process is done by heat, mechanical or chemical process.

8. A method of making User-Friendly USB high-temperature grade Male connectors, comprising steps of:
    (a) providing a fixture with a gap to hold a Printed Circuit Board (PCB), a holder to hold a metal housing with said gap inside;
    (b) inserting said PCB into said gap;
    (c) inserting said metal housing into said holder;
    (d) inserting solid high-temperature grade spacers into said metal housing;
    (e) dispensing liquid-form material inside said metal housing; and,
    (f) curing said liquid-form material over said solid high-temperature grade spacers,
    whereby said spacers with cured said liquid-form material will secure the said PCB within said metal housing.

9. The method of making User-Friendly USB Male connector in claim 8, wherein said fixture is made of heat-resistance, chemical-resistance, non-stick, anti-scratch and dimensional-stable materials.

10. The method of making User-Friendly USB Male connector in claim 9, wherein said heat-resistance, chemical-resistance, non-stick, anti-scratch, dimensional-stable materials is Polytetrafluoroethylene (PTFE), also known as Teflon™ or equivalent.

11. The method of making User-Friendly USB Male connector in claim 8, wherein said solid high-temperature grade spacers are made of Fire Retardant (FR4) fiber glass epoxy, Liquid Crystal Polymer (LCP), cement, ceramic, glass-filled Nylon™ materials or equivalent.

12. The method of making User-Friendly USB Male connector in claim 8, wherein said User-Friendly USB Male connector is for high-temperature assembly purpose.

13. The method of making User-Friendly USB Male connector in claim 8, wherein said method of making high-temperature grade User-Friendly USB Male connector is for both manual labor and automated assembly.

14. The method of making User-Friendly USB Male connector in claim 8, wherein said liquid-form materials are hi-temperature grade glue, epoxy resin or equivalent can be heat or room temperature cured.

15. A method of making User-Friendly USB high-temperature grade Male connectors, comprising steps of:
    (a) providing a fixture with a gap to hold a Printed Circuit Board (PCB), a holder to hold a metal housing with said gap inside;
    (b) inserting said PCB into said gap;
    (c) inserting said metal housing into said holder;
    (d) dispensing liquid-form material inside said metal housing; and,
    (e) curing said liquid-form material,
    whereby spacers are formed by cured said liquid-form material that secure the said PCB within said metal housing.

16. The method of making User-Friendly USB Male connector in claim 15, wherein said fixture is made of heat-resistance, chemical-resistance, non-stick, anti-scratch and dimensional-stable materials.

17. The method of making User-Friendly USB Male connector in claim 16, wherein said heat-resistance, chemical-resistance, non-stick, anti-scratch, dimensional-stable material is Polytetrafluoroethylene (PTFE), also known as Teflon™ or equivalent.

18. The method of making User-Friendly USB Male connector in claim 15, wherein said User-Friendly USB Male connector is for high-temperature assembly purpose.

19. The method of making User-Friendly USB Male connector in claim 15, wherein said liquid-form materials are made of melted high-temperature grade plastic, epoxy resin or equivalent.

20. The method of making User-Friendly USB Male connector in claim 15, wherein said method of making User-Friendly high-temperature grade USB Male connector is for both manual labor and automated assembly.

* * * * *